United States Patent [19]
Debbaut

[11] Patent Number: 5,140,746
[45] Date of Patent: * Aug. 25, 1992

[54] METHOD AND DEVICE FOR MAKING ELECTRICAL CONNECTOR

[75] Inventor: Christian A. M. Debbaut, Cary, N.C.

[73] Assignee: Raychem Corporation, Menlo Park, Calif.

[*] Notice: The portion of the term of this patent subsequent to Jan. 6, 2004 has been disclaimed.

[21] Appl. No.: 396,575

[22] Filed: Aug. 21, 1989

Related U.S. Application Data

[63] Continuation of Ser. No. 183,546, Apr. 18, 1988, Pat. No. 4,864,725, which is a continuation of Ser. No. 38,415, Apr. 9, 1987, abandoned, which is a continuation of Ser. No. 756,559, Jul. 17, 1985, abandoned, which is a continuation of Ser. No. 507,433, Jun. 23, 1983, abandoned, which is a continuation-in-part of Ser. No. 504,000, Jun. 13, 1983, Pat. No. 4,634,207, which is a continuation-in-part of Ser. No. 434,011, Oct. 12, 1982, Pat. No. 4,600,261.

[51] Int. Cl.$^5$ ................. H01R 43/00; B23P 19/00
[52] U.S. Cl. ......................... 29/855; 29/749; 29/858; 29/868; 174/76; 174/84 C; 174/88 C; 174/92; 264/272.11; 428/260; 428/904
[58] Field of Search ............... 29/858, 855, 868, 749, 29/871, 872, 862; 174/76, 84 C, 84 R, 87, 85, 88 C, 92, 93; 524/157, 267, 491, 848; 264/272.11, 46.4; 428/904, 260; 260/33.6

[56] References Cited
U.S. PATENT DOCUMENTS

| | | | |
|---|---|---|---|
| Re. 30,321 | 7/1980 | Brauer et al. | 260/18 |
| Re. 31,389 | 9/1983 | Braver et al. | 210/321.3 |
| 3,020,260 | 2/1962 | Nelson | 260/46.5 |
| 3,065,292 | 11/1962 | Chickvary . | |
| 3,187,088 | 6/1965 | Warner . | |
| 3,228,820 | 1/1966 | Samson | 156/307 |
| 3,241,095 | 3/1966 | Phillips . | |
| 3,243,211 | 3/1966 | Wetmore | 287/78 |
| 3,427,393 | 2/1969 | Masterson . | |
| 3,485,787 | 12/1969 | Haefele et al. | 260/33.6 |
| 3,522,576 | 8/1970 | Cairns . | |
| 3,548,420 | 12/1970 | Spence | 3/20 |
| 3,585,275 | 6/1971 | Gillemot et al. | 174/76 |
| 3,619,481 | 11/1971 | Smith . | |
| 3,630,905 | 12/1971 | Sorgo | 260/85.1 |
| 3,649,436 | 5/1972 | Buese | 161/160 |
| 3,676,387 | 7/1972 | Lindlof | 260/28.5 |
| 3,678,174 | 7/1972 | Ganzhorn . | |
| 3,714,110 | 1/1973 | Verdol et al. . | |
| 3,718,619 | 2/1973 | Rustab . | |
| 3,731,258 | 5/1973 | Spicer . | |
| 3,755,241 | 8/1973 | Brady . | |
| 3,801,532 | 4/1974 | Olstowski . | |
| 3,827,999 | 8/1974 | Crossland | 260/33.6 |
| 3,846,355 | 11/1974 | Mayer . | |
| 3,853,805 | 12/1974 | Miller et al. | 260/37 |
| 3,873,757 | 3/1975 | Berke et al. | 174/52 |
| 3,879,575 | 4/1975 | Dobbin et al. | 174/76 |
| 3,897,129 | 7/1975 | Farrar, Jr. . | |
| 3,916,082 | 10/1975 | Gillemot . | |
| 3,928,704 | 12/1975 | Heidingsfeld et al. | 428/260 |
| 3,929,949 | 12/1975 | Day et al. | 264/46.4 |
| 3,934,076 | 1/1976 | Smith | 174/87 |

(List continued on next page.)

FOREIGN PATENT DOCUMENTS

| | | | |
|---|---|---|---|
| 46063 | 2/1982 | European Pat. Off. . | |
| 52-66979 | 6/1977 | Japan . | |
| 54-30609 | 9/1979 | Japan . | |
| 1303581 | 1/1973 | United Kingdom . | |
| 2020658 | 9/1981 | United Kingdom | 1/64 |

Primary Examiner—Carl J. Arbes
Attorney, Agent, or Firm—A. Stephen Zavell; Herb Burkard

[57] ABSTRACT

An apparatus and process for splicing electrical wires that are to be exposed to an adverse environment. The apparatus includes a connector, an insulating sleeve adapted to retain the connector, and an encapsulant. The encapsulant, which is disposed within the insulating sleeve, has a cone penetration value of 100 to 350 ($10^{-1}$ mm) and an ultimate elongation of at least 200%.

31 Claims, 1 Drawing Sheet

U.S. PATENT DOCUMENTS

| | | | |
|---|---|---|---|
| 3,937,870 | 2/1976 | Bumpstead et al. | 174/87 |
| 3,985,951 | 10/1976 | Harris . | |
| 4,010,994 | 3/1977 | Aysta . | |
| 4,025,717 | 5/1977 | Whittingham . | |
| 4,039,742 | 8/1977 | Smith | 174/87 |
| 4,070,543 | 1/1978 | Thompson | 174/87 |
| 4,102,716 | 5/1979 | Groves et al. | 155/48 |
| 4,168,258 | 9/1979 | Brauer et al. | 260/33.6 |
| 4,171,998 | 10/1979 | Brauer et al. | 156/48 |
| 4,176,239 | 11/1979 | Brauer et al. | 174/23 |
| 4,208,788 | 6/1980 | Siden | 29/862 |
| 4,214,121 | 7/1980 | Charneski et al. . | |
| 4,231,986 | 11/1980 | Brauer et al. . | |
| 4,281,210 | 7/1981 | Brauer et al. | 179/23 |
| 4,297,155 | 10/1981 | Jervis . | |
| 4,326,767 | 4/1982 | Silbernagel et al. . | |
| 4,369,284 | 1/1983 | Chen . | |
| 4,375,521 | 6/1983 | Arnold | 523/173 |
| 4,423,918 | 1/1984 | Filreis et al. . | |
| 4,504,699 | 3/1985 | Dones et al. . | |

OTHER PUBLICATIONS

Brochure: Slygard ® 51 Diaelectric Gel: Dow Corning Bulletin: 05-2043 Dec., 1967.

Brochure: Slygard ® 527 primerless silicone dielectric gel ©1980.

ASTM Designation 50/69(79) Std Test Methods for Cone Penetration of Lubricating Grease.

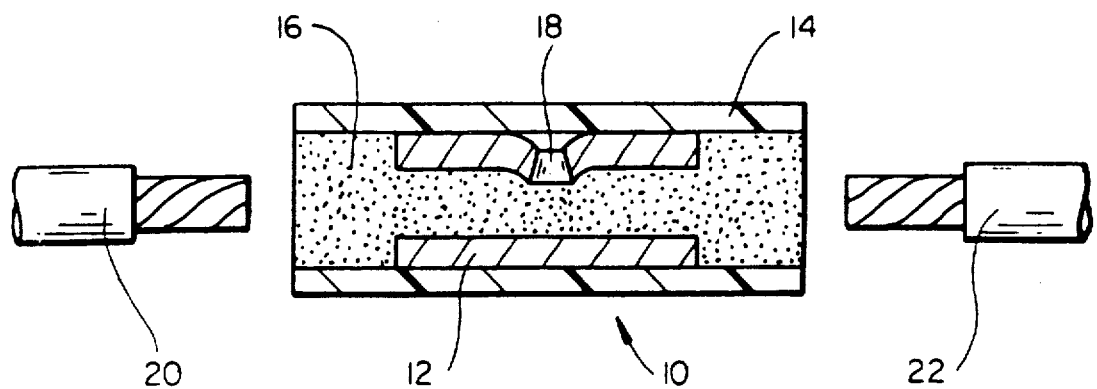
FIG_1
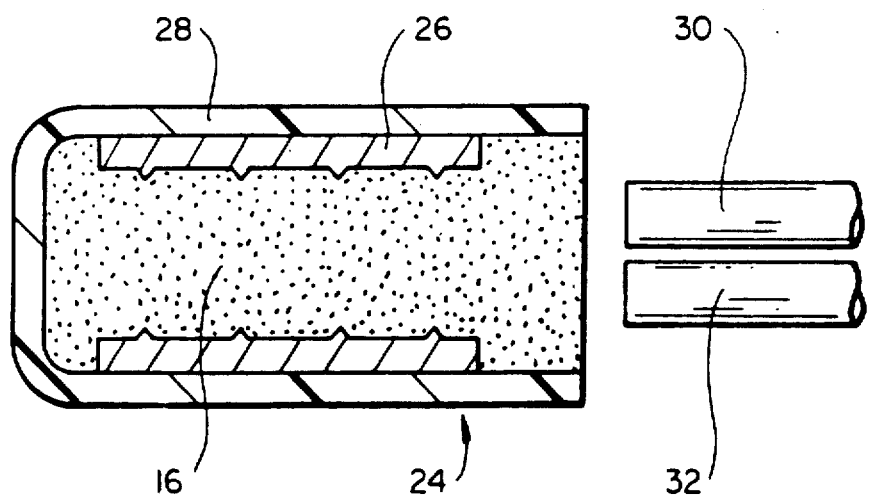
FIG_2

METHOD AND DEVICE FOR MAKING ELECTRICAL CONNECTOR

RELATED U.S. APPLICATION DATA

This application is a continuation of U.S. Ser. No. 07/183,546 filed Apr. 18, 1988, now U.S. Pat. No. 4,864,725, which is a continuation of U.S. Ser. No. 07/038,415 filed Apr. 9, 1987, now abandoned, which is a continuation of U.S. Ser. No. 06/756,559 filed Jul. 17, 1985, now abandoned, which is a continuation of U.S. Ser. No. 06/507,433 filed Jun. 23, 1983, now abandoned, which is a continuation-in-part of U.S. Ser. No. 06/504,000 filed Jun. 13, 1983, now U.S. Pat. No. 4,634,207 which is a continuation-in-part of U.S. Ser. No. 06/434,011 filed Oct. 12, 1982, now U.S. Pat. No. 4,600,261.

TECHNICAL FIELD

The present invention relates to electrical connectors in which connection between electrical wires is effected by mechanical deformation of the connector.

BACKGROUND ART

It is well known to splice (i.e. connect) electrical wires by placing them within a connector and then permanently deforming the connector by mechanical pressure—see for example U.S. Pat. No. 4,208,788 to Siden. If the electrical wires so spliced are to be used in a corrosive, moist or hazardous environment, it is desirable to provide an environmental seal in association with the pressure connector in order to maintain an acceptable electrical connection between the electrical wires.

Such environmental seals are known and include, for example, a special box which is designed to house the wire splice. In practice, however, the special box does not provide a hermetic seal; ultimately, moisture and/or other foreign substances may permeate the special box and induce corrosion within the wire splice.

Other known environmental seals include a method of covering the spliced wires with a silicone grease. The silicone grease, however, is unsatisfactory since it can coat apparatus that should remain clean, and is displaced by vibration.

Environmental seals further include a crimp splicer wherein there is an associated insulating heat shrinkable sleeve which is adapted to retain a crimp barrel therein. In practice, the heat shrinkable sleeve may be shrunk down around the barrel and electrical wires in order to protect the splice from the environment. In some cases, however, it is disadvantageous or even prohibited, to employ a heating unit to heatshrink the sleeve.

SUMMARY OF THE INVENTION

I have now discovered an improved electrical pressure connector, which protects the electrical wires from a corrosive, moist or hazardous environment. The apparatus of the present invention is easy and convenient to employ and dispenses with a need for grease or a heat unit.

In one aspect, the present invention provides a connector, an insulating sleeve adapted to retain the connector, and an encapsulant disposed within the insulating sleeve and/or the connector, the encapsulant having a cone penetration value of 150 to 350 ($10^{-1}$ mm) and an ultimate elongation of at least 200%.

In another aspect, the present invention provides a process for splicing electrical wires, comprising the steps of:
 (a) inserting end sections of at least two electrical wires into an apparatus that comprises:
  (i) an electrical connector;
  (ii) a deformable insulating sleeve that surrounds and retains said electrical connector; and
  (iii) an encapsulant disposed within said insulating sleeve, said encapsulant having a cone penetration value of 100 to 350 ($10^{-1}$ mm) and an ultimate elongation of at least 200%; and
 (b) exerting pressure on said electrical connector through said insulating sleeve, thereby permanently deforming the connector to electrically connect said electrical wires and encapsulate the electrical connection within the encapsulant.

The end sections of the wires can be stripped of insulation before being inserted into the connector, which, when it is crimped, mechanically deforms the end sections so that they are in physical as well as electrical contact. Alternatively the insulation can be left on the wires, in which case the connector must comprise an insulation displacing member which, when the connector is crimped, displaces insulation on the end sections and effects electrical connection between the wires.

BRIEF DESCRIPTION OF THE DRAWING

The invention is illustrated in the accompanying drawing in which:

FIG. 1 is a cross-sectional view of a first embodiment of the present invention; and FIG. 2 is a cross-sectional view of a second embodiment of the present invention.

DETAILED DESCRIPTION OF THE INVENTION

The invention is described herein mainly by reference to an in-line crimp splicer as shown in FIG. 1, but it is to be understood that the invention extends to electrical pressure connectors, generally, and therefore further encompasses e.g. pigtail connectors (or wire joints). It is also noted that the invention may be practiced when it is desired to connect two or more electrical wires.

Attention, accordingly, is directed to FIG. 1 which shows a cross-sectional view of a crimp splicer 10. The crimp splicer 10 includes three elements: a connector 12, an insulating sleeve 14 and an encapsulant 16. These elements are now discussed in detail, but it is to be understood that the various features disclosed with reference to FIG. 1 are also applicable, mutatis mutandis, to other pressure connectors of the invention.

The connector 12 is preferably cylindrical or barrel shaped and consists of a ductile metal which is a good conductor and is capable of being deformed with a crimping device (not shown). Suitable metals are copper, aluminum or brass. The connector 12 is also provided with a centrally located conductor stop 18 formed by perforating one side of the wall of the connector 12 and forcing a portion of the wall into the interior of the connector 12.

The insulating sleeve 14 is generally cylindrically-shaped and has a bore formed therein which runs the length of the sleeve. The sleeve 14 is shaped and sized to enable mechanical retention of the connector 12 disposed within the bore of the sleeve 14. Suitable materials for the sleeve 14 include nylon and polyvinylidene fluoride, since the necessary crimping force can be applied through these materials, in an appropriate manner well known in the art, without damage to the insulating sleeve or loss of retention of the connector 12.

The encapsulant 16 has a cone penetration value of 100 to 350 ($10^{-1}$ mm), preferably 100 to 250. (Note that the cone penetration value is determined in accordance with the American National Standard Desinnation ASIM D217-68 on an undisturbed sample at 70° F.±5° F. using a standard 1:1 scale cone (cone weight 102.5 g, shaft weight 47.5 g), the penetration being measured after 5 seconds). Further, the encapsulant 16 has an ultimate elongation of at least 200%, especially at least 500%: and generally has a maximum tensile strength of approximately 20 psi. (Note that these parameters are determined in accordance with the American National Standard Designation ASTM D638-80, at 70° F.±5° F., using a Type 4 die to cut the sample and at a speed of 50 cm/minute).

The encapsulant 16 may be prepared by gelling a liquid mixture comprising suitable gel precursor materials, e. g. polyurethane or polysiloxane precursor materials, together with suitable reactive or non-reactive extenders. For example, suitable encapsulants can be made by gelling a mixture comprising conventional curable polyurethane precursor materials in the presence of substantial quantities of a mineral or vegetable oil or a mixture thereof (e.g. in amount 60 to 80%) or a suitable plasticizer, e.g. a trimellitate such as n-octyl-n-decyl trimellitate (e.g. in amount 30 to 70%). A suitable reactive extender for polyurethane precursors is a mixture of mineral and vegetable oils in which the ratio by weight of mineral oil to vegetable oil is 0.7 to 2.4, the mixture of oils being present in amount 80 to 60%, preferably 80 to 70%, by weight based on the total weight of the polyurethane precursor materials and the mixture of mineral and vegetable oils. The encapsulant 16 may contain known additives such as moisture scavengers (e.g. benzoyl chloride), antioxidants, fillers, pigments, and fungicides. Especially when the wires are crimped into direct physical contact, the encapsulant can contain abrasive fillers which will pierce through any oxide or other passivating layer on the conductors, particularly aluminum conductors, especially in medium and high voltage joints. Other specific compositions for encapsulant 16 are conceivable and may be employed within the scope of the present invention. For example, the composition may be prepared by curing reactive silicones dissolved in non-reactive extender silicones. The encapsulant 16 is electrically insulating and preferably has a volume resistivity of at least $10^9$ ohms centimeter. Additionally, the encapsulant 16 is hydrolytically stable, moisture insensitive, substantially inert towards the insulating sleeve 14 and tacky.

Note that it is advantageous to dispose the encapsulant 16 within the sleeve 14 so that it substantially fills up the bore which runs the length of the sleeve 14. In this manner, the electrical wires 20 and 22 penetrate the encapsulant 16, which then seals behind the inserted wires 20 and 22. Moreover, the encapsulant 16 is voided from the area of electrical contact by the mechanical pressure generated during the crimping step (d) above. In this way, consequently, the present invention provides an electrical splice: the encapsulant 16 ensures that the splice protects the electrical wires 20 and 22 from a corrosive, moist or hazardous environment. In an alternative embodiment of the present invention, not shown, the sleeve 14 is provided with flexible endguards which shield and protect the encapsulant 16 from dust and incidental contact with solvents.

The apparatus of the present invention also extends to a "B-wire" connector 24 of the type shown in FIG. 2. Here, a connector 26 which is covered with an insulated layer 28 is adapted to receive insulated electrical wires (numerals 30,32). The apparatus comprises an insulationdisplacing member which, when the connector 24 is crimped around insulated electrical wires placed within the connector, displaces insulation on the electrical wires and effects electrical connection between the wires.

The present invention, in summary, may be employed to maintain an acceptable electrical connection between spliced wires by encapsulating and hence sealing the electrical connection from an adverse environment. Although specific embodiments of the present invention have been described herein, it will be obvious to those skilled in the art that various modifications may be made without departing from the spirit of the invention. With the foregoing in mind, it is understood that the invention be accorded the full scope of the appended claims.

I claim:

1. A device for protecting an electrical contact and wire combination comprising:
   (i) a gel which;
      (a) has been preformed apart from the wire to be protected to have an elastic modulus of less than $10^6$ dynes/cm$^2$ and ultimate elongation of at least 200%; and
      (b) is capable of undergoing elastic deformation around the electrical contact and wire combination;
   (ii) a support member for said gel, said support member assisting in containing said gel and protecting the electrical contact and wire combination; and
   (iii) means, operatively associated with said support member, for deforming said gel into close, conforming, and direct contact with the electrical contact and wire combination, at least part of said deformation of said gel being elastic deformation.

2. The device according to claim 1 wherein said means for deforming exerts sufficient pressure on said gel in combination with said support member to seal the electrical contact and wire combination within said gel from the environment.

3. The device according to claim 2 wherein the elastic modulus of said gel is less than $10^5$ dyne/cm$^2$.

4. The device according to claim 2 wherein said support member includes an electrical contact and said gel, said gel having an adhesive strength to the wire to be sealed which is less than the gel's cohesive strength.

5. The device according to claim 1 wherein the elastic modulus of said gel is less than $10^5$ dynes/cm$^2$ and said support member is deformable.

6. The device according to claim 1 wherein said gel is initially formed in contact with said support member and said gel has a cone penetration of 150 to 350 ($10^{-1}$ mm).

7. The device according to claim 1 wherein said support member includes an electrical contact associated with said support member, and where at least part of said means for deforming includes a bolt member and said means for deforming is in combination with said support member and associated with such an electrical contact.

8. The device according to claim 7 wherein said gel has a cone penetration of 150 to 350 ($10^{-1}$ mm).

9. The device according to claim 1 further including an insulation displacement electrical contact contained within said support member.

10. The device according to claim 9 wherein said gel an oil-extended polyurethane and has a cone penetration of 150 to 350 ($10^{-1}$ mm).

11. The device according to claim 9 wherein said gel is initially formed in contact with said support member and electrical contact and said gel has an adhesive strength to the wire to be protected which is less than the gel's adhesive strength to said support member and electrical contact, and also the gel's cohesive strength.

12. The device according to claim 11 wherein said means for deforming includes a force member for maintaining said gel in compressive contact with the electrical contact and wire combination and said force member is selected to include a member from the group consisting of a nut, a bolt, a slip retaining nut member and combinations thereof.

13. The device according to claim 12 wherein said support member is composed of an organic polymeric material and said gel is an aliphatic polyurethane composition selected from the group consisting of a plasticized polyurethane, an oil-extended polyurethane, said gel has a cone penetration value of 150 to 350 ($10^{-1}$ mm).

14. The device according to claim 11 wherein said gel is a silicone gel and has a cone penetration value of 150 to 350 ($10^{-1}$ mm).

15. The device according to claim 1 wherein the properties of said gel are such that a plane of weakness is formed therein when deformed about the wire by the operation of said means for deforming.

16. The device according to claim 1 wherein said gel is selected from the group consisting of gels substantially inert towards the wire; hydrolytically stable moisture insensitive and electrically insulating gels; tacky gels; non-tacky gels; and gels with combinations of properties thereof.

17. A device for protecting an electrical contact and wire combination, comprising:
  (1) a gel which has been preformed in the absence of the wire to be protected to have an elastic modulus of less than $10^6$ dynes/cm$^2$ and an ultimate elongation of at least 200%;
  (2) a support member for said gel; and
  (3) force means to act in operative association with said support member for maintaining said gel in close, conforming and direct contact with the electrical contact and wire combination, at least part of said gel which is in direct contact with the electrical contact and wire combination being elastically deformed.

18. The device according to claim 17 wherein said gel is initially formed in contact with said support member.

19. The device according to claim 18 wherein said gel a cone penetration value of 150-350 ($10^{-1}$ mm), said gel having an adhesive strength to the wire to be sealed which is less than the gel's cohesive strength.

20. The device according to claim 17 wherein said support member includes an electrical contact and said gel is initially formed in contact with said support member and electrical contact.

21. The device according to claim 20 wherein said gel has an adhesive strength to the wire to be sealed which is less than the gel's cohesive strength.

22. The device according to claim 21 wherein said gel a cone penetration of 150-350 ($10^{-1}$ mm).

23. The device according to claim 17 wherein with said support member includes an insulation displacement electrical contact and said gel, said gel having an adhesive strength the wire to be sealed which is less than the gel's cohesive strength and an elastic modulus of less than $10^5$ dynes/cm$^2$.

24. The device according to claim 23 wherein said gel has a cone penetration value of 150-350 ($10^{-1}$ mm).

25. In combination, a substrate wherein the substrate comprises at least an electrical contact and wire combination, an electrically insulating gel associated with said substrate, said gel having an elastic modulus of less than $10^6$ dynes/cm$^2$ and an ultimate elongation of at least 200%, said gel preformed in the absence of the wire to be protected, wherein said gel undergoes elastic deformation at least at the interface between the combination and said gel directly in contact therewith when compressed thereon, and a member operatively acting in conjunction with said substrate for deforming and compressing said gel into close and conforming contact with the combination.

26. The device according to claim 25 wherein said gel has an adhesive strength to the combination which is less than the gel's cohesive strength and an elastic modulus of less than $10^5$ dynes/cm$^2$, and said substrate includes a support member.

27. The device according to claim 26 wherein said gel has a maximum tensile strength of less than 20 psi and a cone penetration value of 150-350 ($10^{-1}$ mm) and the electrical contact is an insulation displacement contact.

28. A process for environmentally protecting a combined electrical contact and wire substrate comprising the steps of:
  (a) placing a device into contact with the electrical contact and wire substrate, the device comprising a support member and a gel which, prior to coming into contact with the electrical contact and wire substrate to be protected, is elastic and adherent to said support member and which has an elastic modulus of less than $10^6$ dyne/cm$^2$ and an ultimate elongation of at least 200%; and
  (b) compressing said gel directly contacting the electrical contact and wire substrate into sealing contact therewith.

29. The process according to claim 28 which protects the wires in the articles selected from the group consisting of a telephone circuit wire connector, a telephone termination block, and a telephone splice connector and said gel has an elastic modulus of less than $10^5$ dynes/cm$^2$.

30. The process according to claim 29 wherein said gel has an adhesive strength to the electrical contact and wire substrate which is less than the gel's cohesive strength and said device includes said electrical contact and the compressing is created by a force which is selected from the group of forces which is substantially non-varying in time or dynamic.

31. The process according to claim 30 wherein said gel has a cone penetration value of 150-350 ($10^{-1}$ mm) and wherein said compressing is achieved by the rotation of a bolt head.

* * * * *

UNITED STATES PATENT AND TRADEMARK OFFICE
CERTIFICATE OF CORRECTION

PATENT NO. : 5,140,746
DATED : August 25, 1992
INVENTOR(S) : Christian A.M. Debbaut It is certified that error appears in the above-indentified patent and that said Letters Patent is hereby corrected as shown below:

Between Column 1, line 3, and Column 1, line 5, insert:

--This application is a continuation-in-part of my Application Serial No. 06/504,000 filed June 13, 1983, which is a continuation-in-part of my Application Serial No. 06/434,011, filed October 12, 1982. The disclosure of both those applications are incorporated by reference herein.--

Signed and Sealed this

Eighth Day of June, 1993

Attest:

MICHAEL K. KIRK

Attesting Officer

Acting Commissioner of Patents and Trademarks